| United States Patent [19] | [11] Patent Number: 4,598,165 |
|---|---|
| Tsai | [45] Date of Patent: Jul. 1, 1986 |

[54] CONFORMABLE ELECTROMAGNETIC SHIELD

[76] Inventor: James T. Tsai, 32760 Mono Lake La., Fremont, Calif. 94536

[21] Appl. No.: 729,193

[22] Filed: May 1, 1985

[51] Int. Cl.$^4$ ............................................. H01B 11/06
[52] U.S. Cl. ...................................... 174/36; 174/78; 174/109; 174/DIG. 8
[58] Field of Search ......... 174/36, 78, 102 R, DIG. 8, 174/109

[56] References Cited

U.S. PATENT DOCUMENTS

| 7,607 | 12/1815 | Rosselli | 174/109 |
|---|---|---|---|
| 3,467,761 | 9/1969 | Plummer | 174/DIG. 8 X |
| 3,576,387 | 4/1971 | Derby | 174/DIG. 8 X |
| 3,790,697 | 2/1974 | Buckingham | 174/109 X |
| 4,246,438 | 1/1981 | Gozlan | 174/DIG. 8 X |

*Primary Examiner*—A. T. Grimley
*Assistant Examiner*—Morris H. Nimmo
*Attorney, Agent, or Firm*—Robert C. Hill

[57] ABSTRACT

A sleeve for installation on an electrical conductor for shielding the conductor with respect to the environment in which the conductor resides against electromagnetic interference (EMI). The sleeve is formed of a tubular member made of heat recoverable material and having, in the non-recovered condition, a large central opening through which the wire to be shielded can be passed. The interior of the tubular member is lined with a plurality of conductive leaves or pellicles. One circumferential margin of the pellicles is adhered to the internal surface of the tubular member and the remainder of each pellicle is unattached and remains in overlapping relationship to an adjacent pellicle. When the sleeve is positioned over a conductor to be shielded and energy is applied to the tubular member to effect its recovery, the unattached portions of the pellicles move with respect to one another as the tubular member shrinks to uniformly circumscribe the conductor with an electrically conductive shield. A fusible coating on each of the pellicles that fuses during the shrinking process and then solidifies so as to enhance the structural and electrical continuity of the shield formed by the device. A plurality of small diameter wires, one being attached to each of the pellicles can be employed to effect electrical connection of the pellicles with external circuit points, such as the shield existing on conventional cable and or a grounded terminal.

10 Claims, 4 Drawing Figures

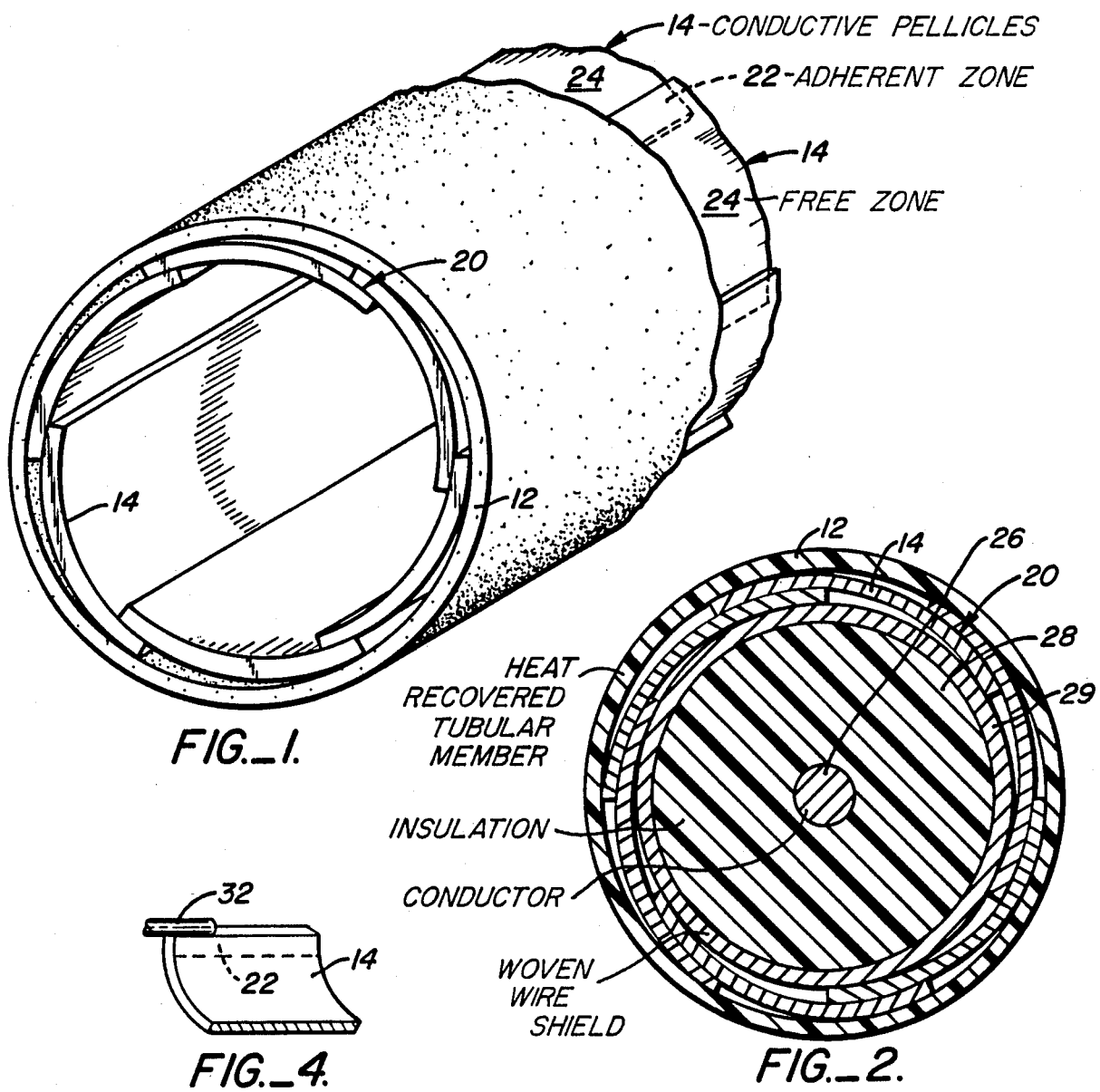
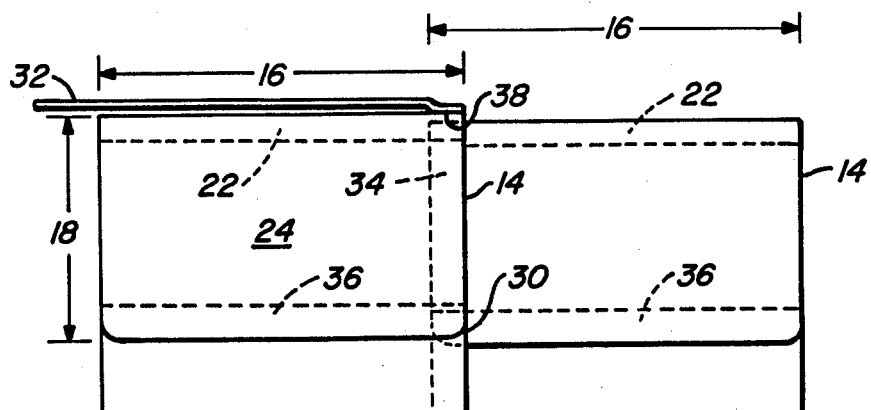

4,598,165

CONFORMABLE ELECTROMAGNETIC SHIELD

BACKGROUND OF THE INVENTION

1. Field of the Invention

This invention relates to an electromagnetic shield for conductors and more particularly to a shield that is particularly useful in shielding a splice in shielded conductors.

2. Description of the Prior Art

Because signal carrying conductors can generate electromagnetic interference (EMI) and because EMI external to a conductor can adversely affect the quality of signals on the conductor, it is known to provide an electromagnetic shield that completely surrounds the circuit conductor and is grounded at one or more points. Typical materials employed for shielding include a fine mesh woven from small diameter conductors and rigid metallic conduit. So long as the integrity of the mesh is maintained, it affords good shielding and possesses a degree of flexibility sufficient to permit conductors to be installed in virtually any desired location.

There are certain environments in which the woven mesh shielding does not afford a complete solution to EMI problems. For example, in certain inexpensive consumer equipment, the cost of woven shielding is not justified. In other cases, where shielded conductors must be spliced, either the mating ends at the splice must be fitted with connectors, which are both expensive and require substantial time to install, or the effectiveness of the shielding will be impaired.

U.S. Pat. No. 3,576,387 discloses a heat shrinkable electromagnetic shield for electrical conductors in which there is a heat shrinkable outer tube on the interior of which is a plastic layer in which conductive metallic particles are embedded. Although the structure described in the cited patent affords EMI shielding superior to a bare wire, the degree of shielding afforded is much less than that obtained with a conductive mesh or metal conduit.

SUMMARY OF THE INVENTION

According to the present invention, there is a section of heat shrinkable tubing which in the untreated state defines an opening substantially larger than the conductor and insulation that is to be shielded. Lining the interior of the heat shrinkable tubular member is a series of thin overlapping conductive leaves or pellicles. One edge of each pellicle is adhesively secured to the interior surface of the heat shrinkable tube in mutual overlapping relationship; the opposite edge of each pellicle is free to move. When the device of the invention is placed on a conductor and is treated with heat energy, or the like, to cause it to shrink, the free edges of the pellicles translate along the surfaces of adjacent pellicles so that a tightly wound continuous conductive structure is formed as the tubing shrinks into embracing relation with the central conductor and its insulation.

An object of the invention is to provide a shielding sleeve for conductors that can be installed quickly and conveniently and that affords a continuous shield that entirely circumscribes the conductor. This object is achieved because the unsecured edges of the pellicles move along the surface of adjacent pellicles, but the edges of the pellicles that are fixed to the interior of the sleeve serve to maintain spacing between adjacent pellicles to assure continuous circumscription of the conductor.

In cases where a device of the invention is installed on a splice between two pieces of shielded cable in which the shield of each piece is partially exposed, substantial continuity of the shield across the splice is achieved by physical contact between the pellicles and the exposed woven shield on the two pieces of cable. In other applications, a more positive electrical path can be established by connecting a fine termination wire to each of the pellicles and by extending the termination wires so that their ends terminate externally of the sleeve. Thus, either before or after the tube is shrunk in place, the terminating wires can be twisted with one another and can be soldered or otherwise affixed to the shield on adjacent pieces of the cable or to ground.

The axial extent of the pellicles can correspond to the axial extent of the heat shrinkable tube, or in the alternative, a plurality of segments can be provided with their axial extremities overlapped to assure continuity. The latter alternative provides a shield that has somewhat more flexibility than the case where each pellicle has an axial extent equal to that of the heat shrinkable tube.

To assure smooth undeformed movement of the free edges of the pellicles into the fully shrunk state, it is desirable to provide rounded corners on the free edges of the pellicles to facilitate their smooth movement over the surfaces of adjacent pellicles during the shrinking process.

The foregoing, together with other objects, features and advantages of the invention, will be more apparent after referring to the following specification and the accompanying drawings.

BRIEF DESCRIPTION OF THE DRAWINGS

FIG. 1 is an isometric view, with portions broken away for clarity, of an exemplary sleeve embodying the invention in an expanded state.

FIG. 2 is a cross-sectional view of the sleeve of FIG. 1 shown in the recovered or contracted state.

FIG. 3 is a fragmentary view of a portion of the pellicles showing their overlapping relationship and showing rounded corners which facilitate smooth shrinking thereof.

FIG. 4 is a detail view at enlarged scale showing attachment of a termination wire to the inner or fixed edge of a pellicle.

DETAILED DESCRIPTION OF A PREFERRED EMBODIMENT

Referring more particularly to the drawings, reference numeral 12 indicates a hollow tubular member that is formed of heat recoverable or heat shrinkable material capable of existing in an expanded state, at which a large diameter opening is formed and in a recovered or shrunk state, at which the opening is reduced to a small diameter opening so that the walls of tubular member 12 will snugly embrace an object such as an electrical conductor in the opening. Specific examples of suitable heat shrinkable material are given in the previously cited '387 patent and include polyolefins and the like. Such materials are widely available in comerce and include materials that can be shrunk by heat, radiant energy at various wavelengths and other thoroughly documented techniques. Thus the terms "heat shrinkable" and "heat recoverable," as used in the present description and in industry, are intended to include, in addition to material that contracts in response to thermal energy, material that contracts in response to other forms of energy.

Tubular member 12 can have virtually any practical length so long as the length is adequate to shield the conductor or conductors that require the same. Fixed interiorly of tubular member 12 to the inner surface of the wall that defines the tubular member is a plurality of conductive pellicles 14. Each pellicle (see FIG. 3) has an axial extent 16 and a circumferential extent 18 of pellicles 14, which when combined with the total number of pellicles counted in a circumferential direction must exceed the internal circumference of tubular member 12 so as to form overlapping regions, one of which is indicated in FIG. 1 at 20, between circumferential extremities of adjacent pellicles. The pellicles have exterior surfaces and interior surfaces. On the exterior surface of each pellicle, at a region adjacent overlap 20, there is an adherent zone indicated at 22 in FIG. 1. Adherent zone 22 functions to fix one circumferential margin of each pellicle 14 to the inner surface of tubular member 12. The portion of the outer surface of each pellicle 14 remote from adherent zone 12 is characterized herein as the free zone 24 and is either unattached to the inner surface of tubular member and the adjacent pellicle, or is adhered to the inner surface of the adjacent pellicle by adhesive having different properties from that present in adherent zone 22. More specifically, if hot melt adhesive is employed in forming adherent zone 22, any adhesive employed in the free zone surface of pellicle 14 must have a melting point at a temperature below that of adhesive in the adherent zone.

As will be elaborated more fully hereinafter, the fact that the surface portion of pellicle 14 remote from adherent zone 22 is relatively free to move with respect to adjacent pellicles during recovery of tubular member 12 enables the parts of the structure described to assume the position seen in FIG. 2 after recovery of tubular member 12. In FIG. 2, reference chararacter 26 identifies a single central conductor; the central conductor is surrounded by a continuous insulative body 28 which can be surrounded by a woven conductive shield 29. Pellicles 14 are tightly drawn by tubular member 12 in the recovered state at which the interior surfaces of pellicles 14 are drawn into intimate physical and electrical contact with conductive shield 29.

The operation of the most general form of the invention, as described immediately above, will be explained in connection with formation of a splice in conventional shielded coaxial cable. Conventional coaxial cable is similar to that depicted in FIG. 2 except that circumscribing the outer surface of woven wire shield 29 is an insulative jacket. Typical practice in splicing or otherwise terminating a coaxial cable includes stripping sufficient insulative material, woven shield and outer protective jacket to expose the central conductor, exemplified at 26 in FIG. 2, so that it can be twisted and soldered or otherwise spliced. In stripping the outer layers from the central conductor preparatory to using the present invention, a sufficient length of the outer protective cover is removed in order to expose the woven wire shield. With two confronting pieces of coaxial cable prepared as described immediately above, a structure of the type shown in FIG. 1 is centered over the splice. The length of tubular member 12 and pellicles 14 are such that the opposite axial extremities of the sleeve at least partially overlap the exposed portions of woven shield on the two confronting pieces of coaxial cable. With the sleeve in such position, heat is applied to tubular member 12 so as to cause the same to recover or shrink. As the tubular member shrinks, it moves into the position seen in FIG. 2 at which pellicles 14 smoothly overlap one another and are tightly drawn into contact with the exposed woven shield portions of the coaxial cable to establish a circuit between the two exposed shield portions and to entirely circumscribe the conductor. Thus, the continuity of the shield is maintained throughout the length of the splice and throughout the length of the cable of which it is a part.

In moving from the expanded condition of FIG. 1 to the shrunk or recovered position of FIG. 2, wrinkling or kinking of conductive pellicles 14 is avoided because the free zones of each respective pellicle move smoothly, gradually and uniformly over the inner surface of an adjacent pellicle. One modification for facilitating the smooth movement is to provide at the corners of the free zone rounded portions 30, seen in FIG. 3. The rounded corner substantially eliminates any tendency for the free zone of the pellicles to be deformed as the sleeve moves from the expanded position to the shrunk or recovered position.

In environments wherein a cable or conductor carrying a sleeve in accordance with the invention is subject to flexure, there is a possibility of relative movement between the region of contact between the axial extremities of pellicles 14 and the woven cable shield. RF leakage can occur at such region. To reduce or eliminate any tendency of leakage and to assure electrical continuity between the woven shield of adjacent cable lengths, a modification of the invention, shown in FIG. 4, includes small diameter wire having one end affixed to each pellicle 14. Wire 32 is typically formed of copper wire or the like and is attached to the edge of the pellicle 14 by welding or the like. The edge to which the conductor is affixed is the edge adjacent to adherent zone 22. Selection of a conductor 32 of the correct gauge and careful attachment to the edge of each pellicle avoids creation and any rough projections that might tend to interfere with the smooth movement of the free zone of an adjacent pellicle over the point of affixment during contraction of the sleeve from the expanded state to the recovered state.

In employing a sleeve of the invention equipped with the modification of FIG. 4, after the sleeve has been treated to bring it to the recovered state a plurality of fine wires protrude from one or both ends of the sleve. These wires can be twisted together and can be terminated, such as by soldering, to an exposed portion of the cable shield. In practicing this modification of the invention, it is desirable, after formation of the connection between the protruding wires and the cable shield, to add further insulation to the connection.

Yet another modification can be employed when it is desired to provide a sleeve of substantial length or a sleeve wherein a degree of flexibility is needed. To achieve these characteristics each individual pellicle 14 has an axial extent 16 that is less than the overall axial extent of tubular member 12. As seen in FIG. 3, adjacent axially aligned pellicles have an overlapping region 34 as well as a circumferential overlapping region 36 so that, after shrinkage of the sleeve onto a conductor, a continuous conductive shielding layer is produced. In FIG. 3, a termination wire 32 is shown; the termination has an extent sufficient to be affixed, as indicated at 38, to each pellicle in an axial extending group of pellicles in order that positive electrical continuity between the pellicles and between the pellicle group and a shield on the cable to which the device is attached can be maintained.

Conductive pellicles 14 can be constructed of such material as thin sheet stainless steel or copper. It is preferable in the case where copper is employed to provide a thin, conductive, non-oxidizable coating on the surface of the pellicles. Alternatively, the surface of the pellicle can be coated with some alloy, in the nature of solder, having a low melting point, i.e. a melting point at or below the temperature required to effect recovery of tubular member 12. When pellicles coated with such alloy are employed, the alloy material fuses when heat is applied to effect recovery of the heat recoverable tubular member, and upon restoration of temperature to ambient, the alloy solidifies to effect a substantially continuous RF shield around the interior of the tubular member.

Another material that makes effective coating on the conductive surfaces of the pellicles is conductive hot melt adhesive, such adhesive typically including a suitable thermoplastic material in which conductive particles are suspended. In this form of the invention, it is desirable that the hot melt material coated on the pellicle surfaces be chosen so that it fuses at a temperature below the temperature necessary to effect recovery of tubular member 12. In this way the hot melt material can distribute itself uniformly as the tubular member 12 is shrunk into place. Upon restoration to ambient temperature, the conductive hot melt adhesive solidifies and affords a substantially continuous conductive sleeve that totally circumscribes the central conductor.

In the specific embodiment shown in FIG. 1, there are six pellicles, which are uniformly spaced through the circumference of the inner opening formed by sleeve 12. Six pellicles are shown by way of example and not by way of limitation. For example, the pellicles can be fewer in number or greater in number so long as the circumferential dimension of each pellicle is such that it slightly overlaps the adjacent pellicle in the expanded state and overlaps the adjacent pellicle or pellicles to a greater extent in the contracted or recovered state. In this respect, the ratio of the axial dimension of a pellicle to the circumferential dimension is characterized as an aspect ratio. A pellicle having a high aspect ratio, i.e. having a large axial dimension compared to the circumferential dimension, yields a more rigid sleeve (in the recovered state) than will a pellicle with a low aspect ratio. The circumferential dimension of each individual pellicle is preferable within a range of about one-half to one-tenth the outside diameter of tubular sleeve 12, and the number of pellicles needed is a function of such circumferential extent. That is to say if the pellicles have a circumferential dimension of about one-half the outside diameter of tubular member 12, seven pellicles are required on the interior surface of tubular sleeve 12 to achieve the required overlap of adjacent pellicles. If the circumferential dimension of each pellicle is about one-tenth the outside diameter of tubular member 12, at least thirty-two pellicles are needed. The axial dimension of the pellicles for a given length of tube 12 can be any practical dimension so long as there is axial overlap between adjacent pellicles to assure electrical continuity throughout the sleeve when in the recovered state.

Although numerous forms of heat recoverable material having numerous characteristics are known and are useful in practicing the invention, it has been found that materials having shrink ratios in the range of about 1.1 times to about 4 times produce the most satisfactory results. In fabricating a device according to the invention, a second tubular member can be placed in the first tubular member, the second tubular member being constituted by a hot melt adhesive layer ranging in thickness from about 1 to 20 mils. Hot melt adhesive EEA, EVA, plexar and polyamide having a hot melt index of from about 1 to about 100 can be used to advantage. Preferably, the hot melt layer interior of tube 12 has conductive metal particles suspended therein, a range of about 5 percent to about 30 percent of conductive particles by volume being effective to enhance the effectiveness of shielding. In cases where the inner surface of tubular member 12 is lined with hot melt adhesive material, it is desirable that the hot melt adhesive material melt at a temperature that is approximately 10° C. or less below the recovery temperature of the tubular member. Of course both the tubular member 12 and the inner adhesive layer, if used, can be formed together by co-extrusion in accordance with well-known techniques.

Although the orientation of the pellicle edge is shown in the drawing to be perpendicular to the axis of tubular member 12, the pellicles can be installed obliquely of such angle or, indeed, can be formed as parallelograms rather than as rectangles. Such shape and/or orientation of the pellicles serves well so long as the requisite overlap is present.

The adherent zone referred to previously and identified by reference numeral 22 must be sufficient to effect adherence of one circumferential edge of the pellicle interior of tubular member 12 but should be limited so that free zone 24 is large enough to move smoothly over an adjacent pellicle during the recovery process. It has been found that if the circumferential extent of zone 22 is established at about one-fifth the circumferential extent of the pellicle, excellent results are achieved.

Thus, it will be seen that the present invention provides a device for shielding a conductor against EMI that can be installed quickly and efficiently and that provides an extremely high degree of shielding. Athough one embodiment of the invention has been shown and described, it will be apparent that other adaptations and modifications can be made without departing from the true spirit and scope of the invention.

What is claimed is:

1. An article of manufacture for affording electromagnetic shielding around at least one exposed electrical conductor comprising a hollow tubular member formed of tubular heat recoverable material capable of existing in an expanded state in which a large diameter opening is formed and a recovered state in which a small diameter opening is formed, said tubular member being dimensioned so that said large diameter opening affords substantially unrestricted entry of a conductor in said opening, a plurality of conductive pellicles each having an axial extent and a circumferential extent, means forming an adherent zone on circumferential margin of each said pellicle at which each pellicle is adhered to the interior surface of said tubular member, the portion of each said pellicle remote from said adherent zone being a free zone, said pellicles being circumferentially spaced and dimensioned so that the free zone of each said pellicle overlaps the adherent zone of an adjacent pellicle in the expanded state, and so that in response to application of energy to said tubular member to effect recovery to the recovered state said free zones move smoothly along the respective surfaces of adjacent pellicles to effect complete circumscription of an electrical conductor by said pellicles.

2. An article of manufacture according to claim 1 including at least one termination wire connected to at least one said pellicle interior, said tubular member adjacent the adherent zone of the pellicle, said termination wire extending exteriorly of said tubular member to afford electrical connection with an external conductive member.

3. An article of manufacture according to claim 1 wherein the axial extremities at the edge of the free zone of each said pellicle has a smoothly rounded corner so as to facilitate movement of the free zone of the pellicle along the surface of an adjacent pellicle.

4. An article of manufacture according to claim 1 wherein the axial extent of each said pellicle is less than the axial extent of said tubular member and wherein there is a pellicle group constituted by a plurality of axially aligned individual pellicles extending throughout a distance corresponding to that of the tubular member, each individual pellicle in said pellicle group overlapping axially adjacent pellicles to afford uninterrupted continuity therein.

5. An article of manufacture according to claim 1 wherein the circumferential extent of each said pellicle is in a range of about one-half to about one-tenth the outside diameter of said tubular member.

6. An article of manufacture according to claim 1 including a layer of hot melt glue lining the interior surface of said tubular member, said layer serving to effect adherence between said adherent zone and the inner surface of said tubular wall, there being conductive particles suspended within said glue layer, said glue layer softening at a temperature no greater than the recovery temperature of said tubular member.

7. An article of manufacture according to claim 1 wherein said tubular member moves from said expanded state to said recovered state at a recovery temperature, the free zone of said pellicles being coated with a fusible material which fuses at a temperature below said recovery temperature.

8. An article of manufacture according to claim 7 wherein said fusible material is a solder-like compound.

9. An article of manufacture according to claim 7 wherein said fusible material is a coating of hot melt adhesive having a fusion temperature below said recovery temperature.

10. An article of manufacture according to claim 9 wherein said hot melt adhesive has conductive particles suspended therein.

* * * * *